United States Patent
Li et al.

(10) Patent No.: US 9,791,790 B2
(45) Date of Patent: Oct. 17, 2017

(54) METHOD OF ALIGNING QUADRATE WAFER IN FIRST PHOTOLITHOGRAPHY PROCESS

(71) Applicant: INSTITUTE OF SEMICONDUCTORS, CHINESE ACADEMY OF SCIENCES, Beijing (CN)

(72) Inventors: Jinmin Li, Beijing (CN); Junxi Wang, Beijing (CN); Qingfeng Kong, Beijing (CN); Jinxia Guo, Beijing (CN); Xiaoyan Yi, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/901,541

(22) PCT Filed: Jan. 3, 2014

(86) PCT No.: PCT/CN2014/070051
§ 371 (c)(1),
(2) Date: Dec. 28, 2015

(87) PCT Pub. No.: WO2015/054977
PCT Pub. Date: Apr. 23, 2015

(65) Prior Publication Data
US 2016/0170317 A1 Jun. 16, 2016

(30) Foreign Application Priority Data
Oct. 16, 2013 (CN) .......................... 2013 1 0485162

(51) Int. Cl.
*G03F 9/00* (2006.01)
*G03F 1/42* (2012.01)
(52) U.S. Cl.
CPC .............. *G03F 9/7084* (2013.01); *G03F 1/42* (2013.01)

(58) Field of Classification Search
CPC .................................. G03F 9/7084; G03F 1/42
USPC .......................................................... 430/22
See application file for complete search history.

(56) References Cited

U.S. PATENT DOCUMENTS

| 5,532,091 A | 7/1996 | Mizutani |
| 6,929,888 B2 | 8/2005 | Kim |
| 2005/0250291 A1 | 11/2005 | Baluswamy et al. |
| 2012/0058581 A1 | 3/2012 | Tsuji |

FOREIGN PATENT DOCUMENTS

| CN | 101369571 A | 2/2009 |
| CN | 101458443 A | 6/2009 |
| CN | 103296031 A | 9/2013 |
| JP | 7-169673 A | 7/1995 |
| JP | 9-171610 A | 6/1997 |

OTHER PUBLICATIONS

Extended European Search Report, dated May 8, 2017, for corresponding European Application No. 14853966.1-1551 / 3059635, 8 pages.

*Primary Examiner* — Christopher Young
(74) *Attorney, Agent, or Firm* — Seed IP Law Group LLP

(57) ABSTRACT

The present invention provides a method of aligning a quadrate wafer in a first photolithography process. The method includes: step A: fabricating mask aligning markers in a periphery region of a mask, which is used for a first exposure process of the quadrate wafer, around a mask pattern of the mask; step B: during the first exposure process, positioning the quadrate wafer in a preset region by using the mask aligning markers on the mask, and exposing the quadrate wafer through the mask; and step C: performing alignment for the quadrate wafer during a second exposure process and subsequent exposure processes by using aligning markers on the quadrate wafer that are obtained during the first exposure process. The method may be easily and reliably performed to ensure intact dies at periphery of a quadrate wafer to be produced and thus render increased yield of chips.

11 Claims, 3 Drawing Sheets

METHOD OF ALIGNING QUADRATE WAFER IN FIRST PHOTOLITHOGRAPHY PROCESS

BACKGROUND

Technical Field

The present invention relates to semiconductor technology field, and particularly to a method of aligning a quadrate wafer during a first photolithography process.

Description of the Related Art

It is common that only a quadrate or rectangular die can be produced due to limitation from cutting a wafer during manufacturing dies from the wafer, which renders waste during cutting a circular wafer in virtue of cutting lots of incompleted dies at periphery of the wafer. By comparison, for a quadrate or rectangular wafer, no incompleted die is formed during cutting the quadrate wafer as the edges of the quadrate wafer are parallel to a cutting direction and are different from the arc edge of the circular wafer.

During manufacturing dies from a wafer, a plurality of processes are needed, including mesa etching, electrode defining, passivation protecting, and thus a series of mask patterns for various processes are needed. As for a circular wafer, it can be exposed under a first mask directly since it is not needed to be aligned to the mask during a first exposure process. A second mask may be aligned to the wafer according to a formed aligning marker formed at a corresponding position of the wafer through the first mask, and so on. However, it is impossible to ensure integrity of dies formed at edges of a quadrate wafer by implementing the above photolithography mask alignment way. As shown in FIG. 1, reference number 21 indicates four sides of a quadrate wafer, and reference 22 indicates dies formed from the quadrate wafer through an existing photolithography process. As shown in FIG. 1, the dies at edges of the quadrate wafer are not intact due to lack of photolithography alignment, which renders waste product.

SUMMARY OF THE DISCLOSURE

Problems to be Solved

Aiming to solve the above problems, it is an object to provide a method of aligning a quadrate wafer during a first photolithography process in order to avoid damage to dies due to exposure processes.

Technical Solution

According to an aspect, there is provided a method of aligning a quadrate wafer during a first photolithography process. The method comprises: step A: fabricating mask aligning markers in a periphery region of a mask, that is used for a first exposure process of the quadrate wafer, with respect to (around) a mask pattern of the mask; step B: during the first exposure process, positioning the quadrate wafer in a preset region by using the mask aligning markers on the mask, and exposing the quadrate wafer by using the mask; and, step C: performing alignment for the quadrate wafer during a second exposure process and subsequent exposure processes by using aligning markers on the quadrate wafer that are obtained during the first exposure process.

Advantageous Effect

The method of aligning the quadrate wafer with masks according to embodiments of the present invention is simply and reliable, easy to be implemented and may ensure producing completed dies at edges of the quadrate wafer and thus increasing yield of chips.

LIST OF REFERENCE NUMBERS

Figure 1:
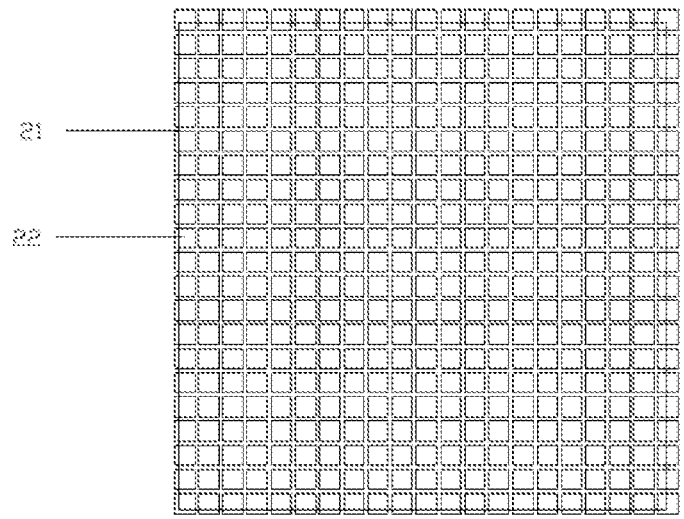
FIG. 1 shows distribution of dies on a quadrate wafer after exposure in a first photolithography process, in which the quadrate wafer is not aligned to a mask used in the first photolithography process.

21—edge of a quadrate wafer; 22—incompleted die at periphery of a wafer; 23—rectangular bar aligning marker; 24—quadrate-frame aligning marker; 25, 26, 27—mask pattern.

DETAILED DESCRIPTION OF THE EMBODIMENTS

In order to make the purposes, technical solutions and advantages of the present invention clearer, the present invention are further described in detail in conjunction with embodiments with reference to the drawings. It is noted that similar or same components are referred by similar reference sign in drawings or specification. The embodiments that are not illustrated or described in the specification may be known by those skilled in the art. In addition, it is appreciated that specific values of parameters in the text are provided for illustration, rather than for defining specific values of the parameters. In the embodiments, directional terms, such as upper, lower, forward, backward, left and right, are only used for directions in the drawings. Thus, the directional terms are not used for limiting the protective scope of the present invention.

Embodiments of the present invention are implemented by forming at least aligning markers at opposite corners of or outside of a quadrate wafer during a preceding photolithography process and performing an aligning process in according with the formed aligning markers during subsequent photolithography processes, ensuring integrity of dies formed at peripheral edges of the quadrate wafer.

In a first embodiment of the present invention, there is provided a method of aligning a quadrate wafer with a mask, in which the quadrate wafer may be a quadrate GaN-based epitaxial LED-contained wafer. A process of manufacturing a LED chip from the epitaxial LED-contained wafer includes a series of processes, such as mesa etching, electrode defining, passivation protecting and the like.

Figure 2:
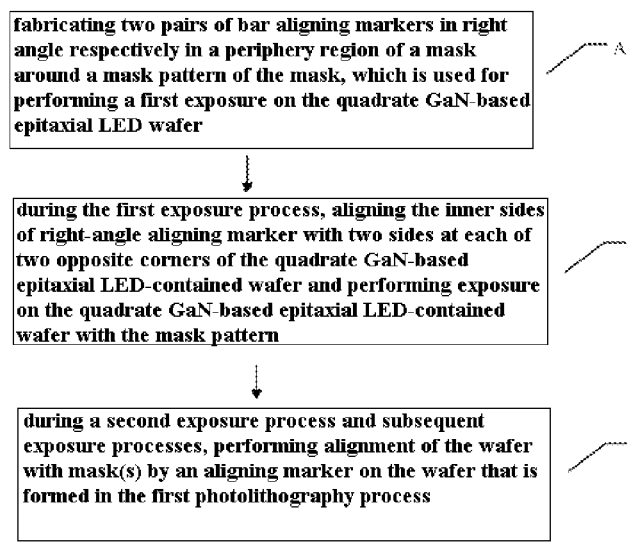
FIG. 2 is a flow chart of a method of aligning a quadrate wafer with a mask during exposure in a first photolithography process according to an embodiment of the present invention.
Figure 4:
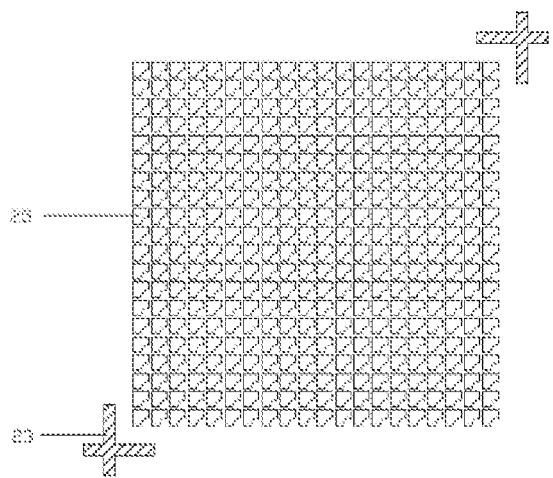
FIG. 4 is an another schematic view of the mask used in the first photolithography process of the method illustrated in FIG. 2.
Figure 5:
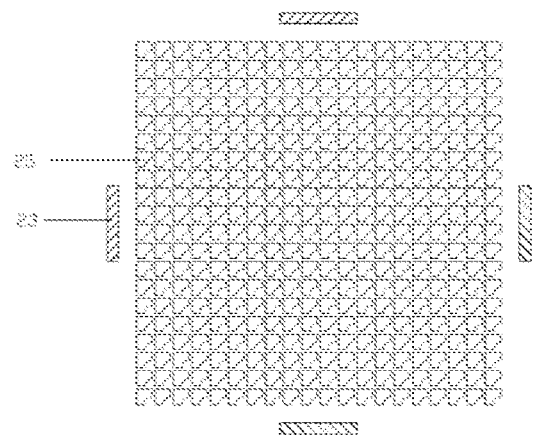
FIG. 5 is a further schematic view of the mask used in the first photolithography process of the method illustrated in FIG. 2.

Referring to FIG. 2, the method of aligning a quadrate wafer with a mask includes:

Step A: fabricating at least two pairs of bar aligning markers parallel to sides of the quadrate wafer respectively in a periphery region of a mask around a mask pattern 25 of the mask, which is used for performing a first exposure on the quadrate wafer, such as, a quadrate GaN-based epitaxial LED wafer, as shown in FIG. 5. The bar aligning markers each have a length and a width that may be set as required. The inner sides of the pair of bar aligning markers are respectively parallel to sides of the quadrate wafer, and preferably, the bar aligning markers are respectively parallel to two sides of the quadrate wafer that are perpendicular to one another. Further, the paired bar aligning markers are perpendicular to one another. Particularly, the aligning marker may be a right-angle or L-shaped aligning marker or a crisscross aligning marker, or a combination thereof. In one example, the paired bar aligning markers may be perpendicular to one another but not crossed, for example, as shown in FIG. 5. The length and width of the bar aligning marker may be configured as required. In another example, the paired bar aligning markers may be perpendicular to and joint to one another, for example, like the right-angle or L-shaped aligning markers shown in FIG. 3. Alternatively, the paired bar aligning markers may be perpendicular to one another and crossed so as to form, for example, a crisscross aligning marker shown in FIG. 4.

According to an embodiment of the present invention, the respective bar aligning markers may be separated from one another. According to an embodiment of the present invention, the paired bar aligning markers may be jointed to each other. According to an embodiment of the present invention, the paired bar aligning markers may be crossed to form a crisscross aligning marker. Those skilled in the art may obtain other arrangements of the bar aligning markers as required, provided that the bar aligning markers are provided to be parallel to corresponding sides of the wafer to achieve alignment purpose.

In a preferred embodiment of the present invention, at least two pairs of bar aligning markers are configured as two right-angle or L-shaped aligning markers 23, and inner sides of the two right-angle or L-shaped aligning markers 23 are parallel to corresponding sides at two opposite corners of the quadrate GaN-based epitaxial LED-contained wafer, respectively.

Figure 3:
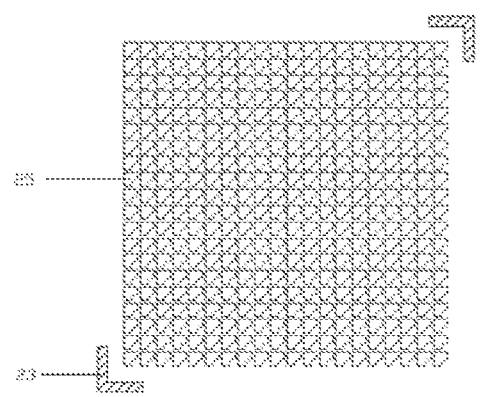
FIG. 3 is a schematic view of the mask used in the first photolithography process of the method illustrated in FIG. 2.

It is noted that the length and width of the right-angle or L-shaped aligning marker 23 may be set as required, provided that two portions of the right-angle or L-shaped aligning marker perpendicular to each other are respectively parallel to two sides of the quadrate wafer perpendicular to each other. In other words, two bars of the right-angle or L-shaped aligning marker are respectively parallel to two sides of the quadrate wafer perpendicular to each other. The right-angle or L-shaped aligning marker shown in FIG. 3 is only provided for illustration, but not for limitation. The right-angle or L-shaped aligning marker 23 may be modified as a "crisscross" aligning marker with four bars extending in four directions. Two bars of the crisscross aligning marker may extend different distances in opposite directions from a cross point of the crisscross aligning marker, as shown in FIG. 4. For example, the number of the right-angle or L-shaped bar aligning markers is at least two, that is, there are at least two pairs of bars each having two bars perpendicular to each other. For example, the number of the right-angle or L-shaped aligning markers may be three or four. The present invention, however, is not limited to these. The inner sides of the right-angle or L-shaped aligning markers are spaced away from corresponding sides of the quadrate GaN-based epitaxial LED-contained wafer to be exposed by a distance in a range from 0 μm to 100 μm, or from 0 μm to 50 μm, i.e., 0 μm≤d≤100 μm, or 0 μm≤d≤50 μm.

In addition, as shown in FIG. 5, the aligning marker 23 may be a bar aligning marker, the length of which may be set depending on dimension of the quadrate wafer, such as, a ratio of the length of the bar aligning marker to the length of the side of the quadrate wafer may be in a range from 1/1000 to 1, or in a range from 1/5 to 1. The bar aligning markers may be located in a periphery region of the mask around the mask pattern 25, are parallel to sides of the quadrate wafer respectively and are spaced away from sides of the quadrate wafer by a distance d in a range from 0 μm to 100 μm.

Step B: during the first exposure process, aligning the inner sides of right-angle or L-shaped aligning marker with two sides at each of two opposite corners of the quadrate GaN-based epitaxial LED-contained wafer and performing exposure on the quadrate GaN-based epitaxial LED-contained wafer with the mask pattern.

Step C: during a second exposure process and subsequent exposure processes, performing alignment of the wafer with mask(s) by an aligning marker on the wafer that is formed in the first photolithography process.

In the embodiment, the photolithography process may be a conventional process.

As the die mesa at periphery of the epitaxial wafer is maintained intact after the first photolithography process, a second mask may be aligned by the aligning markers (which are not the right-angle or L-shaped aligning markers in the first mask in above description) formed at corresponding positions of the wafer through the first mask, and the subsequent masks may be aligned in a similar way, thereby ensuring intactness of the dies at periphery of the epitaxial wafer. As die mesa at periphery of the epitaxial wafer is intact after the first photolithography process, the second mask may be aligned with the epitaxial wafer by means of the aligning markers at positions of the wafer corresponding to the first mask, and so on, thereby ensuring intact dies at periphery of the wafer to be formed and increasing yield of HEMT power device dies. For example, for a 2-inches quadrate epitaxial LED-contained wafer including 45 million dies, the throughout of dies may be increased by 9%. In practice, since alignment is implemented in micro scale, it is a time-and-labor consuming process to implement alignment using specific dimensions. According to the embodiments of the present invention, alignment and positioning of a wafer may be implemented with naked eye without measuring any dimensions or sizes, thereby largely increasing final yield of the wafer and enhancing convenience.

In a second exemplary embodiment of the present invention, there is provided a method of aligning a quadrate wafer with a mask, wherein the quadrate wafer is a quadrate GaN-based HEMT epitaxial wafer. The processes of producing power devices from the GaN-based HEMT epitaxial wafer include a series of photolithography processes for producing source and drain electrodes, mesa etching, and gate electrode.

Figure 6:
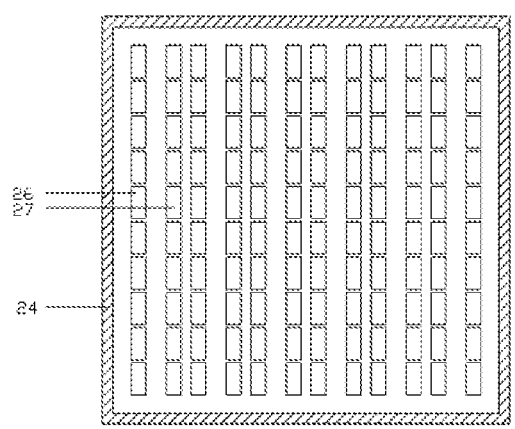
FIG. 6 is a schematic view of the mask used in the first photolithography process according to another embodiment of the present invention.

As shown in FIG. 6, the method of aligning a quadrate wafer with a mask includes:

Step A': forming a quadrate -frame mask aligning marker 24 on periphery of the mask around mask patterns 26, 27 on the mask, which is used for a first exposure for, such as, a quadrate GaN-based HEMT epitaxial wafer, inner sides of the quadrate -frame mask aligning marker 24 corresponding to edges of the quadrate GaN-based HEMT epitaxial wafer, as shown in FIG. 4. The quadrate -frame mask aligning marker 24 is another embodiment of the present invention. It is appreciated by those skilled in the art that, based on the embodiments of the present invention, the bar aligning markers may be in a separated arrangement as in the first embodiment of the present invention, or may be jointed with one another as in the second embodiment of the present invention.

It is noted that a width of the quadrate-frame mask aligning marker 24 may be set as required, provided that two parts of the quadrate-frame mask aligning marker 24 perpendicular to one another, are respectively parallel to two sides, which are perpendicular to one another, of the quadrate wafer. In addition, the inner sides of the quadrate-frame mask aligning marker may be the same as, or may be slightly bigger than corresponding edges of the quadrate GaN-based epitaxial LED-contained wafer, wherein, the distance d between the inner sides of the quadrate-frame mask aligning marker and corresponding edges of the quadrate GaN-based HEMT epitaxial wafer may be in range from 0 µm to 100 µm.

Step B': during the first exposure process, aligning the quadrate-frame mask aligning markers at periphery of the mask with the edges of the quadrate GaN-based HEMT epitaxial wafer and performing the first exposure with the mask pattern of the mask on the quadrate GaN-based HEMT epitaxial wafer.

Step C': during a second exposure process and subsequent exposure, performing subsequent alignment of the wafer with mask(s) by using the aligning markers formed on the wafer during the first photolithography process.

In the embodiment, the photolithography processes may be implemented according to common photolithography processes in prior art. Through the aligning markers, it ensures intact source and drain electrodes of dies at periphery of the quadrate GaN-based HEMT epitaxial wafer. According to conventional photolithography processes, as die mesa at periphery of the epitaxial wafer is intact after the first photolithography process, the second mask may be aligned with the epitaxial wafer with the aligning markers formed at positions of the wafer corresponding to the aligning markers on the first mask, and so on, thereby ensuring intact dies at periphery of the wafer to be formed and increasing yield of dies for HEMT power devices.

Two embodiments of the present invention are described in detailed with reference to the drawings. Those skilled in the art may obtain clear understanding on the method of aligning a quadrate wafer with a mask according to embodiments of the present invention.

In addition, definition of various components and methods are not limited to the specific structures, shapes and approaches described in the above embodiments, but may be modified or replaced by those skilled in the art based on common knowledge. For example, (1) the quadrate wafer may be made of GaN, Si, SiC, GaAs, AlGaInP or GaP; (2) the quadrate wafer may be processed to produce devices, such as, LED, laser device, photodetector, solar cell, and the like.

In sum, there is provided a method of aligning a quadrate wafer with a mask, particularly the method according to preferred embodiment of the present invention, which largely improves operation convenience during alignment and is simple and reliable and easy to be implemented. The method may be performed to ensure intact dies at periphery of a quadrate wafer to be produced and increases yield of chips.

The above embodiments are described to illustrate the purposes, technique solutions and advantageous effects of the present invention. It is understood that the above description is only provided for describing the embodiments of the present invention, but limiting the invention in no way. Any modification, replacement or improvement of the above embodiments within the spirit and principle of the present invention may be obtained and falls within the scope of the invention.

The invention claimed is:

1. A method of aligning a quadrate wafer in a first photolithography process comprising:
   fabricating mask aligning markers in a periphery region of a mask, which is used for a first exposure process of the quadrate wafer, around a mask pattern of the mask;
   during the first exposure process, positioning the quadrate wafer in a preset region by using the mask aligning markers on the mask, and exposing the quadrate wafer through the mask; and
   performing alignment for the quadrate wafer during a second exposure process and subsequent exposure processes by using aligning markers on the quadrate wafer that are obtained during the first exposure process;
   wherein the mask aligning markers include bars that are parallel to sides of the quadrate wafer respectively.

2. The method according to claim 1, wherein the aligning markers include at least two pairs of bars.

3. The method according to claim 2, wherein each pair of bars are configured as a right-angle shaped aligning marker or a crisscross aligning marker.

4. The method according to claim 3, wherein inner sides of at least two right-angle shaped aligning markers or at least two crisscross aligning markers are parallel to sides at at least two corners of the quadrate wafer respectively.

5. The method according to claim 2, wherein four bars of two pairs of bars are connected to form a quadrate-frame, or are separated from one another.

6. The method according to claim 3, wherein the aligning markers includes two, three or four right-angle shaped aligning markers or crisscross aligning markers.

7. The method according to claim 3, wherein the aligning markers include two right-angle shaped aligning markers each comprising a pair of bars, the bars of each of the two right-angle shaped aligning markers being respectively aligned with sides of a corresponding one of two opposite corners of the quadrate wafer.

8. The method according to claim 1, wherein the aligning markers are configured as a quadrate-frame aligning marker; inner sides of the quadrate-frame aligning marker are parallel to peripheral edges of the quadrate wafer respectively.

9. The method according to claim 2, wherein inner sides of the aligning markers are spaced from respective edges of the quadrate wafer by a distance d in a range from 0 µm to 50 µm.

10. The method according to claim 1, wherein the quadrate wafer is made of GaN, Si, SiC, GaAs, AlGaInP or GaP.

11. The method according to claim 1, wherein the method is implemented when producing a LED, a laser, a photoelectric detector or a solar cell device.

* * * * *